US007909502B2

(12) United States Patent
Ehrfeld et al.

(10) Patent No.: US 7,909,502 B2
(45) Date of Patent: Mar. 22, 2011

(54) STATIC LAMINATION MICRO MIXER

(75) Inventors: Wolfgang Ehrfeld, Mainz (DE); Matthias Kroschel, Bad Kreuznach (DE); Till Merkel, Ulm (DE); Frank Herbstritt, Alzey (DE)

(73) Assignee: Ehrfeld Mikrotechnik BTS GmbH, Wendelsheim (DE)

( * ) Notice: Subject to any disclaimer, the term of this patent is extended or adjusted under 35 U.S.C. 154(b) by 1076 days.

(21) Appl. No.: 10/535,262

(22) PCT Filed: Dec. 3, 2003

(86) PCT No.: PCT/EP03/13603

§ 371 (c)(1),
(2), (4) Date: Dec. 13, 2005

(87) PCT Pub. No.: WO2004/052518

PCT Pub. Date: Jun. 24, 2004

(65) Prior Publication Data

US 2006/0087917 A1 Apr. 27, 2006

(30) Foreign Application Priority Data

Dec. 7, 2002 (DE) .............................. 202 18 972 U

(51) Int. Cl.
*B01F 5/00* (2006.01)
*B81B 1/00* (2006.01)

(52) U.S. Cl. .................................. 366/340; 366/DIG. 3

(58) Field of Classification Search .................. 366/336, 366/340, 341, DIG. 3
See application file for complete search history.

(56) References Cited

U.S. PATENT DOCUMENTS

| | | | | |
|---|---|---|---|---|
| 3,881,701 | A | 5/1975 | Schoenman et al. | |
| 4,222,671 | A * | 9/1980 | Gilmore | 366/337 |
| 4,869,849 | A * | 9/1989 | Hirose et al. | 261/78.2 |
| 5,016,707 | A * | 5/1991 | Nguyen | 165/167 |
| 5,534,328 | A | 7/1996 | Ashmead et al. | |
| 5,803,600 | A | 9/1998 | Schubert et al. | 366/144 |
| 5,887,977 | A | 3/1999 | Morikawa | |
| 5,904,424 | A | 5/1999 | Schwesinger et al. | |
| 5,932,100 | A | 8/1999 | Yager et al. | |
| 6,082,891 | A | 7/2000 | Schubert et al. | 366/338 |
| 6,264,900 | B1 | 7/2001 | Schubert et al. | |
| 6,485,690 | B1 * | 11/2002 | Pfost et al. | 422/102 |
| 7,066,641 | B2 | 6/2006 | Honda | |
| 7,223,364 | B1 * | 5/2007 | Johnston et al. | 422/68.1 |
| 2002/0057627 | A1 | 5/2002 | Schubert et al. | 366/336 |
| 2004/0027915 | A1 | 2/2004 | Lowe et al. | |

(Continued)

FOREIGN PATENT DOCUMENTS

DE 44 16 343 11/1995

(Continued)

OTHER PUBLICATIONS

Wolfgang Ehrfeld, et al; Characterization of Mixing in Micromixers by a Test Reaction: Single Mixing Units and Mixer Arrays; Ind. Eng. Chem; Jan. 23, 1999; pp. 1075-1082.

(Continued)

*Primary Examiner* — Tony G Soohoo
(74) *Attorney, Agent, or Firm* — Norris McLaughlin & Marcus, P.A.

(57) ABSTRACT

Static lamination micro mixer comprising at least one slotted plate having slot openings and an aperture plate having aperture slots arranged above the slotted plate.

25 Claims, 11 Drawing Sheets

U.S. PATENT DOCUMENTS

| | | | |
|---|---|---|---|
| 2004/0145967 | A1 | 7/2004 | Honda |
| 2006/0087917 | A1 | 4/2006 | Ehrfeld et al. |

FOREIGN PATENT DOCUMENTS

| | | | |
|---|---|---|---|
| DE | 195 40 292 | | 1/1997 |
| DE | 199 17 156 | | 10/2000 |
| DE | 199 27 554 | | 12/2000 |
| DE | 199 28 123 | | 12/2000 |
| DE | 10041823 | A1 | 3/2002 |
| DE | 20218972 | U1 | 2/2003 |
| JP | 55 147729 | | 10/1980 |
| JP | 11 253775 | | 9/1999 |
| JP | 2002045666 | A | 2/2002 |
| JP | 2002346352 | A | 12/2002 |
| JP | 2002346353 | A | 12/2002 |
| NL | 6 710 428 | | 1/1969 |
| WO | 96/30113 | A1 | 10/1996 |
| WO | WO 97/00442 | | 1/1997 |
| WO | 02/38261 | A1 | 5/2002 |

OTHER PUBLICATIONS

Verena Haverkamp, et al; The Potential of Micromixers for Contacting of Disperse Liquid Phases; Fresenius J Anal Chem, 1999, pp. 617-624.

Claude de Bellefon, et al; Microreactors for Dynamic, High Throughput Screening of Fluid/Liquid Molecular Catalysis; Zuschriften; 2000; pp. 3584-3587.

* cited by examiner

STATIC LAMINATION MICRO MIXER

This is a 371 of PCT/EP2003/013603 filed 3 Dec. 2003 (international filing date).

The invention relates to a micro-mixer for mixing, dispersing, emulsifying or suspending at least two fluid phases, it being necessary for this micro-mixer to have at least one slotted plate having slot openings and an aperture plate having aperture slots arranged above the former. The slot openings in the slotted plate(s) and aperture plate(s) are formed as continuous openings. The opening can be shaped as desired; the opening preferably has a simple geometry (for example a hole or rectangular slot).

BACKGROUND OF THE INVENTION

Static micro-mixers are key elements in micro-reaction technology. Static micro-mixers use the principle of multilamination, in order in this way to achieve rapid mixing of fluid phases by means of diffusion. A geometric configuration of alternately arranged lamellae makes it possible to ensure good mixing in the microscopic range. Multi-lamination mixers made of structured and periodically stacked thin plates are already extensively described in the literature; examples of this will be found in German patents DE 44 16 343, DE 195 40 292 and the German patent application DE 199 28 123. In addition, as opposed to the multi-lamination mixers, which comprise structured and periodically stacked thin plates, the German patent application DE 199 27 554 describes a micromixer for mixing two or more educts, the micro-mixer having mixing cells. Each of these mixing cells has a feed chamber which is adjoined by at least two groups of channel fingers which engage in the manner of a comb between the channel fingers in order to form mixing regions. Above the mixing region there are outlet slots, which extend at right angles to the channel fingers and through which the product emerges. As a result of the parallel connection in two spatial directions, a considerably higher throughput is possible.

SUMMARY OF THE INVENTION

The invention specified in Patent Claim 1 is based on the problem that micro-mixers can clog up with contaminating particles and therefore tend to block; as a result of the inadequate cleaning possibilities, there is a considerable restriction of the possible uses of micro-mixers. In the case of the micro-mixers constructed from plates, the plates are preferably permanently connected to one another and, as a result, the micro-structures are no longer freely accessible; cleaning of the micro-mixers described is therefore not possible in a straightforward manner. In order to clean a corresponding micro-mixer, the plate stack has to be dismantled, which generally proves to be very complicated.

These problems are solved by the static lamination micromixer described in Patent Claim 1 which, in order to mix at least two fluid phases, contains at least one slotted plate having slot openings and an aperture plate having aperture slots arranged above the former. The slot openings are generally formed as continuous openings.

The advantages achieved by the invention consist in the fact that the static lamination micro-mixer can be produced economically, is easy to clean and the fluids to be mixed are mixed rapidly and effectively with one another. In addition, the pressure loss is so low that it can even be used for large throughputs.

Advantageous refinements of the invention are specified in Claim 2 and those following. According to Claim 2, the number of aperture slots in the aperture plate and/or the number of slot openings in the slotted plate can be greater than 1. In the slot openings of the slotted plate, according to Claim 3, the fluid flows led out of various regions of the fluid distribution are led in such a way that they enter the slot opening of a slotted or aperture plate located above. According to Claim 5, the fluid phases come together in the slot openings of the aperture plate. The slot openings in the slotted plate can in this case be offset parallel to one another and/or arranged in a periodic pattern in relation to one another. By means of a suitable geometric form and alignment, slot openings according to Claim 6 in the slotted plate can promote the production of secondary effects. These effects can be produced, for example, by separations of vortices behind the plates or by transverse components from the feed lines. The mixing at the molecular level as a result of diffusion is consequently overlaid by secondary flows, which lead to a shortening of the diffusion paths and therefore the mixing times. According to Claim 7, the slot openings can be arranged obliquely in relation to one another. A further refinement permits the slot openings to be configured in the manner of funnels or lobes. This refinement of the forms can be expedient in order to achieve a uniform pressure distribution in the feed channels. This is a precondition in order to arrive at a uniform mixing quality in the entire component. Furthermore, it is possible for a plurality of slotted plates and/or aperture plates to be arranged offset from one another directly above one another. Deflection of the flow can be achieved according to Claim 9 if slotted plates and/or aperture plates located directly above one another or arranged offset from one another are used. The deflection action can be used, according to Claim 11, to lead the one or more fluid flows specifically to the metering point of one or more fluid flows.

The mixing chamber can be fitted above the aperture plate, according to Claim 12. According to Claim 13, it is also possible for the aperture slots in the aperture plate to be offset parallel to one another and/or arranged in a periodic pattern in relation to one another. A further advantageous refinement of the invention permits the slot openings in the slotted plate and the aperture slots in the aperture plate to be arranged rotated at any desired angle, preferably 90°, in relation to one another. According to Claim 15, it is additionally possible for the slot openings in the slotted plate and the aperture slots in the aperture plate to have a width of less than 500 μm. In order to improve the result when mixing liquids, emulsifying or suspending, slot openings with widths smaller than 100 μm have in particular proven to be worthwhile. The width of the slot openings in the slotted plate is the same for all fluid phases in the basic type of the mixer. However, it has been shown that, in the case of combining fluids which differ in terms of their viscosity and/or in which the volume flows are in a numerical ratio with one another different from 1:1, it may be advantageous if the width and/or shape and cross-section of the slot opening in the slotted plate differ for the various fluids. A further advantageous refinement permits the slotted and aperture plates to consist, partly or completely, of metal, glass, ceramic and plastic or else of a combination of these materials. According to Claim 17, the slotted and aperture plates can be produced by punching, embossing, milling, erosion, etching, plasma etching, laser cutting, laser ablation or by the LIGA technique but preferably by laser cutting or the LIGA technique. A further advantageous refinement permits the slotted and aperture plates to comprise a stack of microstructured thin plates; these thin micro-structured plates can be connected materially to one another by means of soldering, welding, diffusion welding or adhesive bonding or with a force fit by means of screwing, pressing (for example in a housing) or riveting. An advantageous refinement according to Claim 20 permits the aperture slots in the aperture plate and the slot openings in the slotted plate to be of branched configuration. The static micro-mixer obtained in this way can, according to Claim 21, be accommodated in a housing provided for the purpose. According to Claim 22, the housing can contain channels and in this way permits spatial distribution of the fluids. According to Claim 23, these channels can be arranged parallel to one another, radially, concentrically or behind one another. In order to achieve a suitable distribution of the speeds along the channels, it may be advantageous to maintain or to vary the cross sections over their length, according to Claim 24.

According to Claim 25, the micro-mixer can be used individually or as a constituent part of a modularly constructed arrangement for carrying out physical or chemical conversions or, according to Claim 26, together with other functional modules, integrated into one component.

Exemplary embodiments of the inventions are illustrated in the drawings and will be described in more detail below.

BRIEF DESCRIPTION OF THE DRAWINGS

FIG. 9*a*) as a constituent part of an integrated process arrangement together with a heat exchange unit (70).

DETAILED DESCRIPTION

Figure 1:
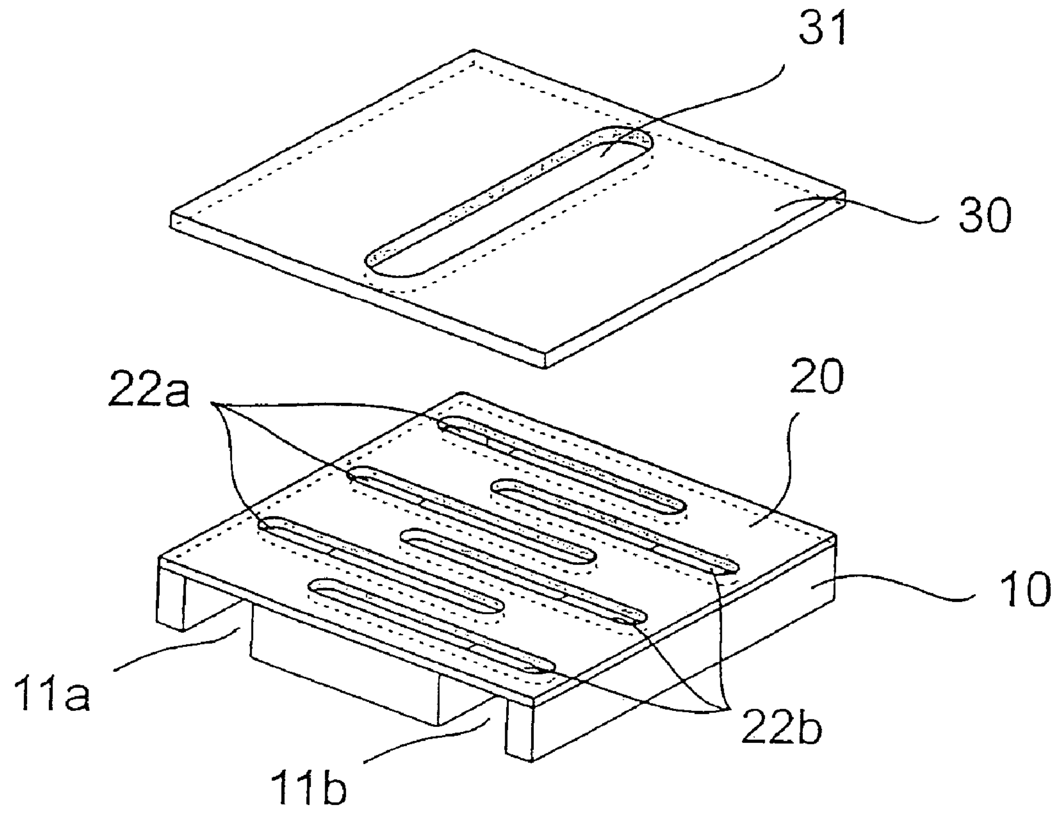
FIG. 1 shows a schematic illustration of the static micro-mixer comprising a slotted plate and an aperture plate.

FIG. 1 shows a schematic illustration of a static lamination micro-mixer comprising lower part 10, a slotted plate 20 and an aperture plate 30. The lower part 10 contains the feed channel 11*a* for the fluid A and the feed channel 11*b* for the fluid B. The slotted plate 20 has slot openings 22*a* and 22*b* for the fluids A and B, which are fed from the feed channel 11*a* and 11*b*. Above the slotted plate 30 there is the aperture plate 30 having an aperture slot 31. In this case, the aperture plate 30 covers the outer region of the slot openings 22*a* and 22*b*, the central region of the slot openings 22*a* and 22*b* overlapping the aperture slot 31 and remaining free as a result.

Figure 2A:
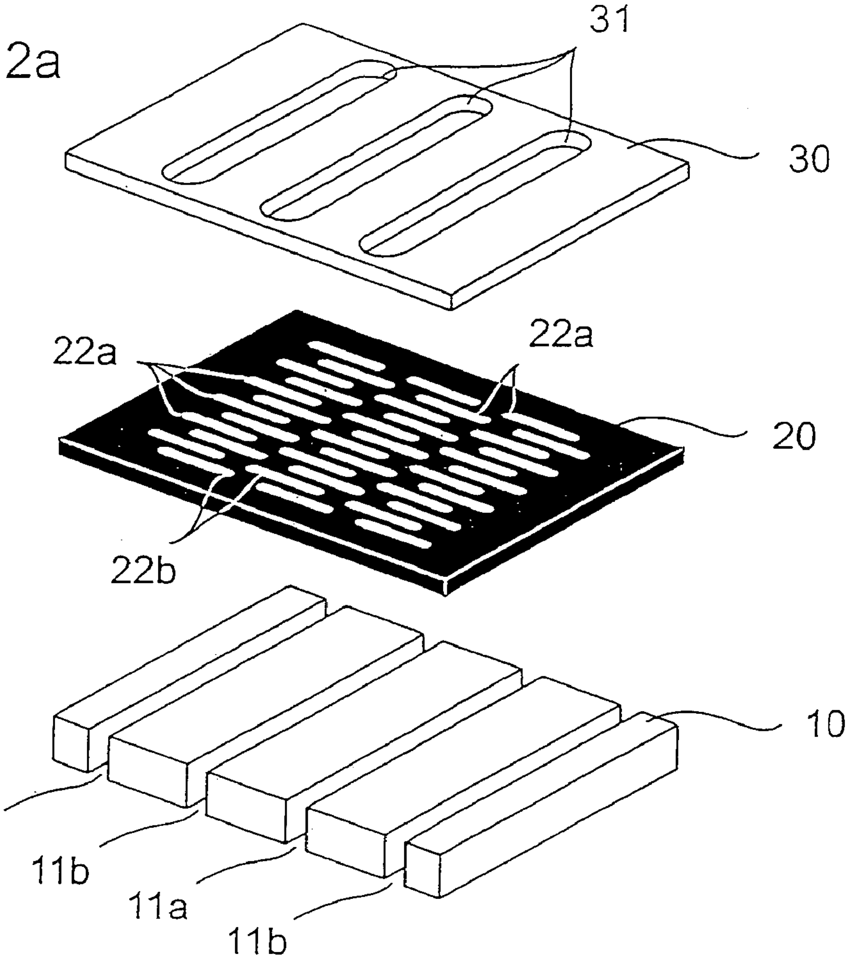
FIG. 2*a* shows an exploded illustration of a static lamination micro-mixer comprising lower housing part (10), feed channels (11), slotted plate (20) and aperture plate (30)

FIG. 2*a* shows the exploded illustration of a static micro-mixer comprising lower part 10, feed channels 11*a* and 11*b*, slotted plate 20 and aperture plate 30. The feed channels 11*a* and 11*b* in each case contain the fluids A and B; above these feed channels there is the slotted plate 20 having the slot openings 22*a* and 22*b*. Located above the latter is the aperture plate 30, whose aperture slots are arranged at an angle of 90° in relation to the slot openings 22*a* and 22*b*.

Figure 2B:
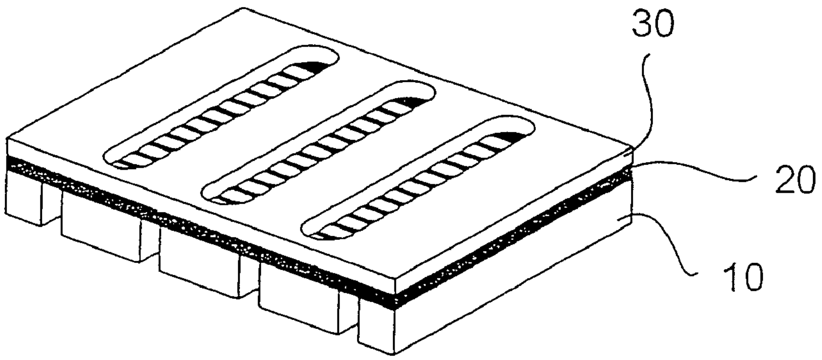
FIG. 2*b* shows an illustration of a static lamination micro-mixer comprising lower housing part (10), feed channels (11), slotted plate (20) and aperture plate (30)

FIG. 2*b* shows a schematic illustration of a static micro-mixer, as illustrated in FIG. 2*a*, comprising lower part 10, slotted plate 20 and aperture plate 30.

Figure 3A:
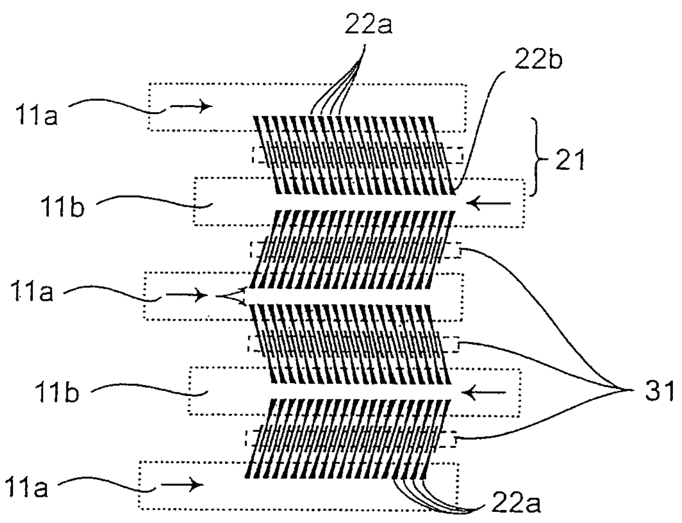
FIG. 3*a* shows a plan view of the feed channels (11), slot openings (22*a*, 22*b*) and aperture slots (31) of a static lamination micro-mixer.
Figure 3B:
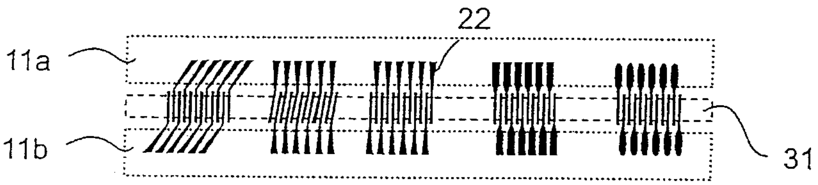
FIG. 3*b* shows a plan view of the slot openings of different geometry and orientation (22) in a slotted plate (20) of a static lamination micro-mixer.
Figure 3C:
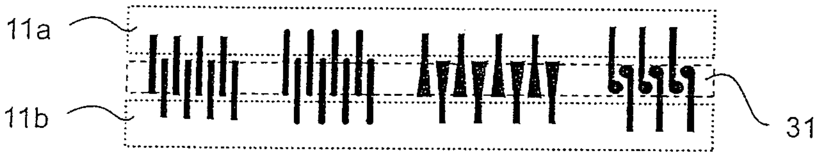
FIG. 3*c* shows a plan view of the slot openings of different geometry and orientation (22) in a slotted plate (20) of a static lamination micro-mixer.
Figure 3D:
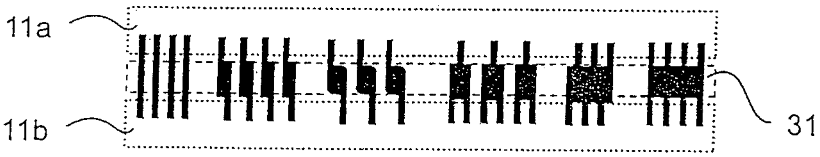
FIG. 3*d* shows a plan view of the slot openings of different geometry and orientation (22) in a slotted plate (20), the slot openings for both fluids overlapping in the plane of the slotted plate.
Figure 3E:
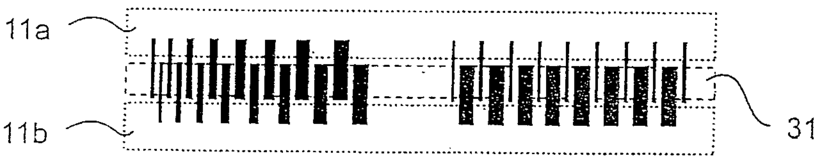
FIG. 3*e* shows a plan view of the slot openings of different geometry and orientation (22) in a slotted plate (20), the slot openings having different widths and forms.

FIG. 3*a* shows slot openings 22*a* and 22*b* arranged as double rows in the form of slotted regions 21. These slotted regions 21 are fed with fluids through the feed channels 11*a* and 11*b*. One half of the slot openings 22*a* overlaps the feed channels 11*a*, the other overlaps the feed channels 11*b*. In the central region of the double rows, the slot openings 22 overlap the aperture slot 31 fitted above. The slot openings 22 can also be arranged obliquely, as illustrated here.

Figure 3F:
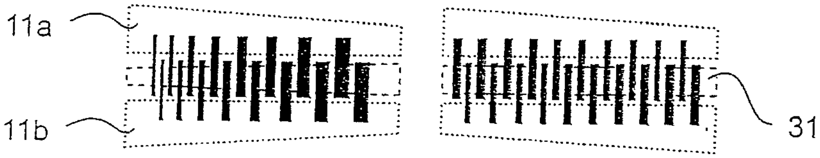
FIG. 3*f* shows a plan view of the slot openings of different geometry and orientation (22) in a slotted plate (20), the slot openings, the aperture slots (31) and/or the feed channels (11) having different and variable widths and forms.

FIG. 3*b*, FIG. 3*c*, FIG. 3*d*, FIG. 3*e* and FIG. 3*f* show slot openings 22 with different geometric configuration and orientation. Underneath the slot openings there are the feed channels 11. Above the slot openings there are the aperture slots 31. The cross sections of the feed channels 11 and of the aperture slots 31 can vary along the course (FIG. 3*f*). The slot openings 22 can be widened in the shape of a funnel. The width and form of the slot openings 22 can vary between the fluids (FIG. 3*e*) and within the fluids (FIG. 3*f*).

Figure 4A:
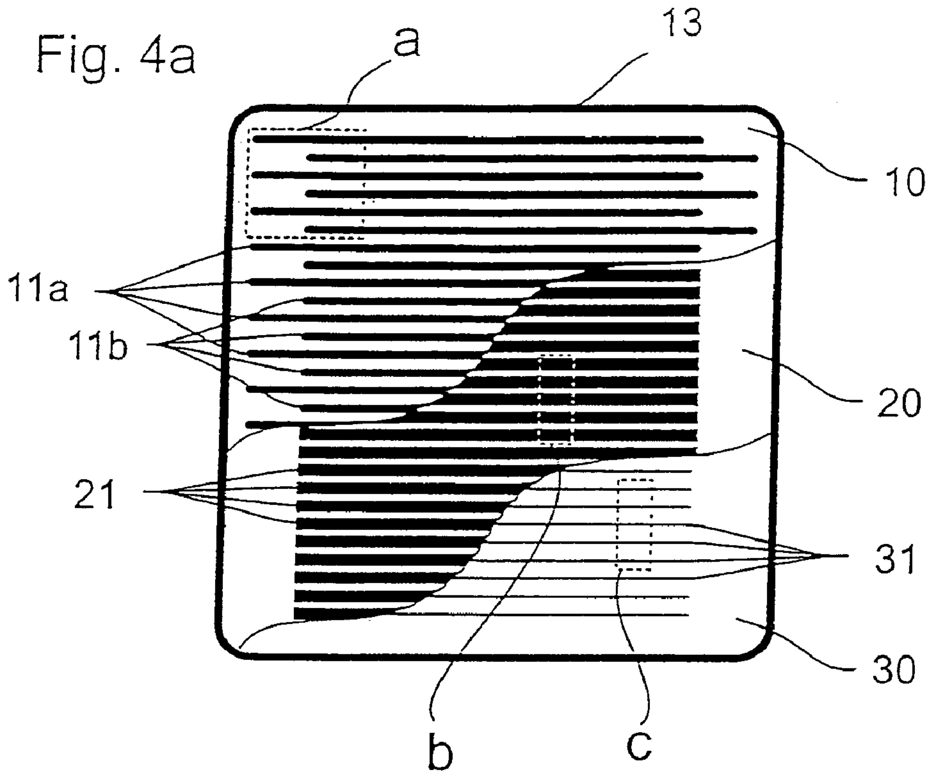
FIG. 4*a* shows a plan view of a static lamination micro-mixer comprising lower housing part (10), slotted plate (20) and aperture plate (30)

FIG. 4*a* shows the plan view of a lower housing part 10. The lower housing part 10 is provided with numerous slot-like feed channels 11*a* and 11*b*, which are illustrated as displaced alternately to the right or left. In the slotted plate 20 arranged above it there is the slotted region 21 illustrated as black bars; here, the slotted region 21 is in each case positioned between two feed channels 11*a* and 11*b*, so that it is overlapped by two feed channels. The aperture slots 31 of the aperture plate 30 located above are found centrally above the slotted regions 21 of the slotted plate 20.

Figure 4B:
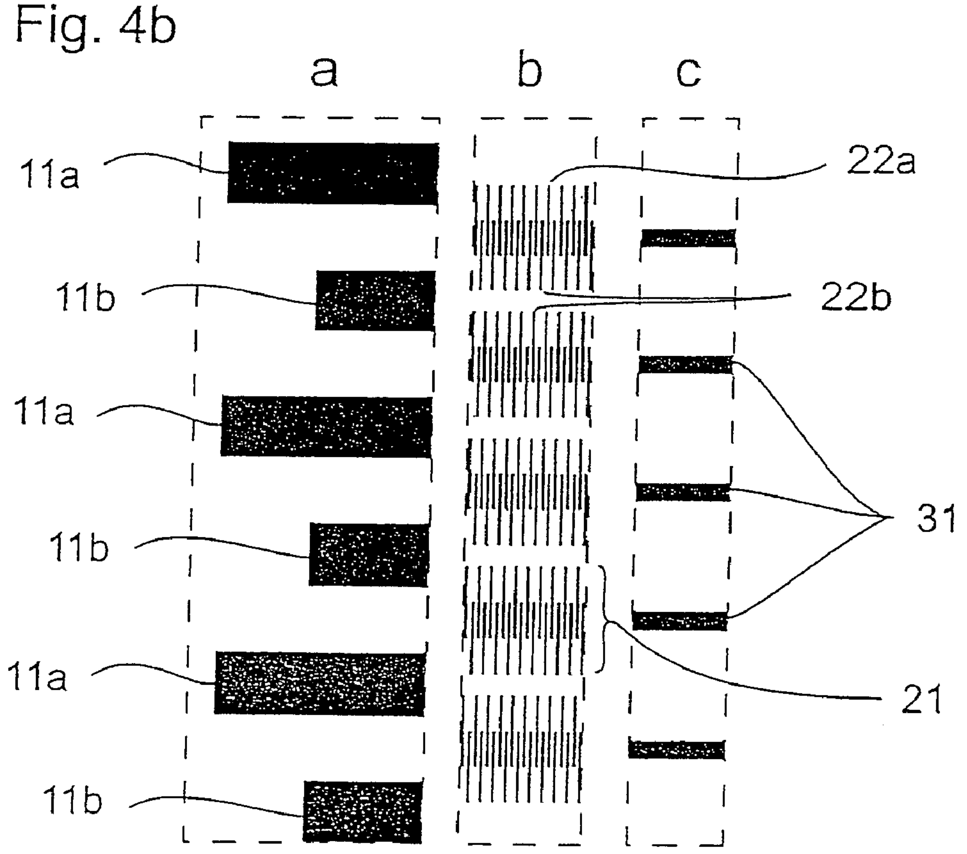
FIG. 4*b* shows a plan view of a static lamination micro-mixer.

FIG. 4*b* shows a schematic arrangement of feed channels 11*a* and 11*b*, slotted regions 21 and aperture slots 31.

Figure 5:
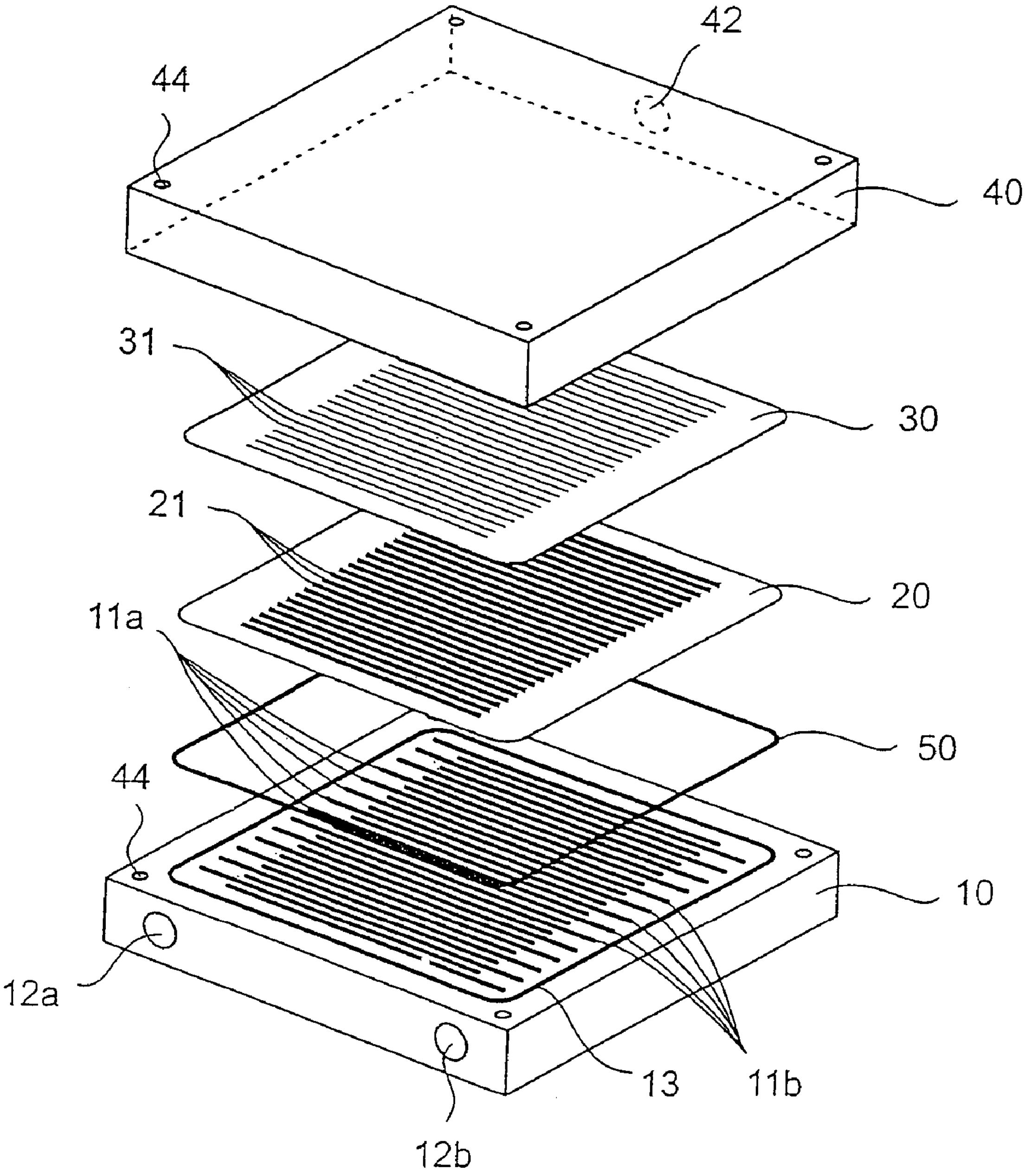
FIG. 5 shows an exploded illustration of a static micro-mixer.

FIG. 5 shows the exploded view of a static lamination micro-mixer; the micro-mixer comprises lower housing part 10 and upper housing part 40. Located between the lower housing part 10 and upper housing part 40 are the slotted plate 20 and the aperture plate 30. In the lower housing part 10 there is a groove 13, into which a sealing ring 50 can be inserted in order in this way to seal off the micro-mixer with respect to the surroundings. The lower housing part 10 and the upper housing part 40 are each provided with openings for fixing elements 44, by means of which the two can be fixed to each other. The lower housing part 10 contains on the outer surface two fluid inlet channels 12*a* and 12*b* for the fluids A and B to be mixed. Machined on the upper side of the lower housing part 10 are numerous slot-like feed channels 11*a* and 11*b*, which are configured to be lengthened alternately to one or the other side and can thus be fed with fluid A or fluid B. The slotted plate 20 contains numerous slotted regions 21; above the slotted plate 20 there is fitted the aperture plate 30, which has a large number of aperture slots 31. The upper housing part 40 contains a fluid outlet 42 for the discharge of the mixture obtained.

Figure 6:
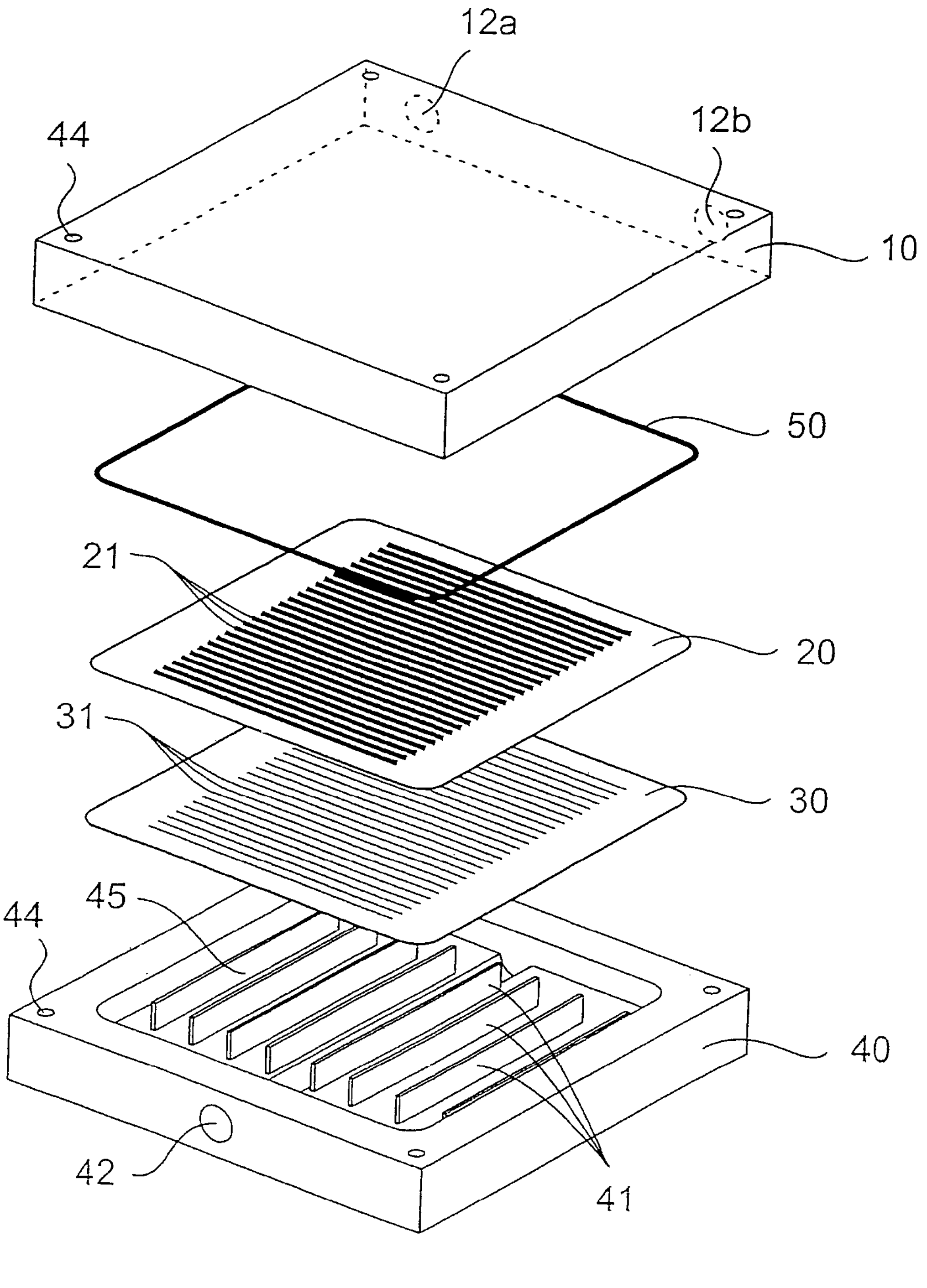
FIG. 6 shows an exploded illustration of a static micro-mixer with the viewing angle from below.

FIG. 6 shows, in analogy with FIG. 5, an exploded illustration of a static lamination micro-mixer with a viewing angle from the underside. The upper housing part 40 contains a large mixing chamber 45, into which all the aperture slots 31 of the aperture plate 30 open. In order to support the aperture plate 30, a plurality of supporting structures 41 are fitted in the upper housing part 40.

Figure 7A:
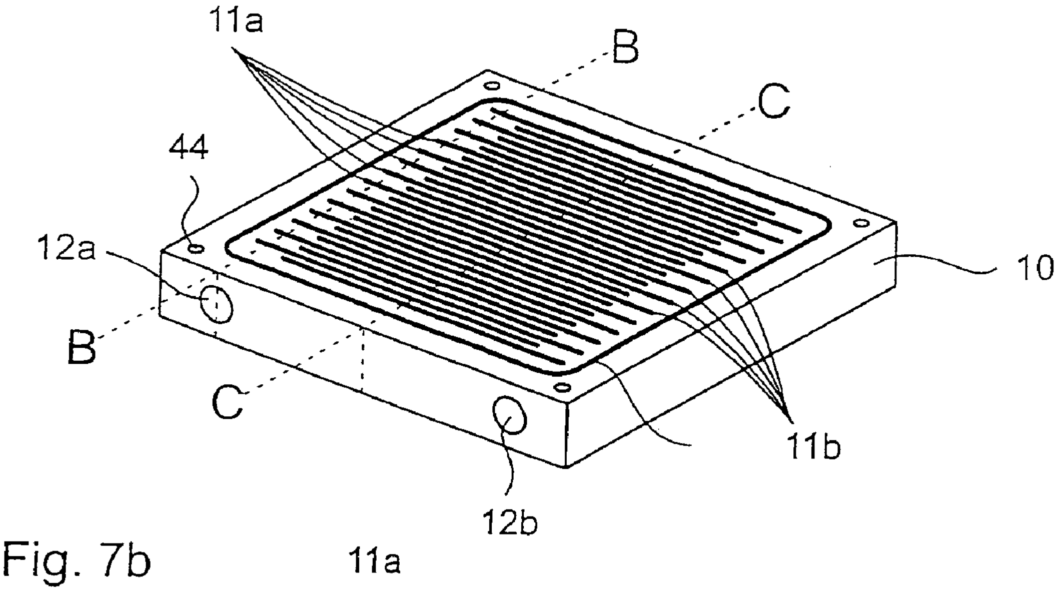
FIG. 7*a* shows a schematic illustration of the lower housing part (10)

FIG. 7*a* shows the schematic illustration of the lower housing part 10. The lower housing part 10 is provided with feed channels 11*a* and 11*b* for the fluids A and B to be mixed. There are fluid inlets 12*a* and 12*b* on the outer sides of the lower housing part. The cutouts 44 in the four corners of the lower housing part 10 permit it to be fixed.

Figure 7B:
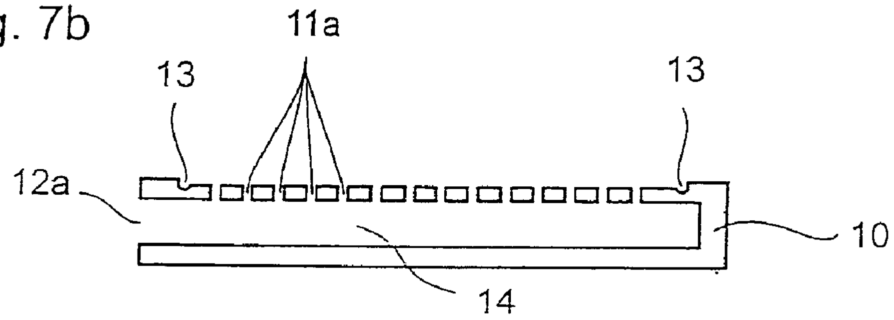
FIG. 7*b* shows a cross section through lower housing part (10) along the plane B-B.

FIG. 7*b* shows the cross section through the lower housing part 10 along the line B-B in FIG. 7*a*. The fluid inlet 12*a* continues into the fluid inlet channel 14 for the fluid A. On the upper side of the fluid inlet channel 14 there are the feed channels 11*a* for the fluid. On the upper side of the lower housing part 10 there is a groove 13 for the insertion of a sealing ring.

Figure 7C:
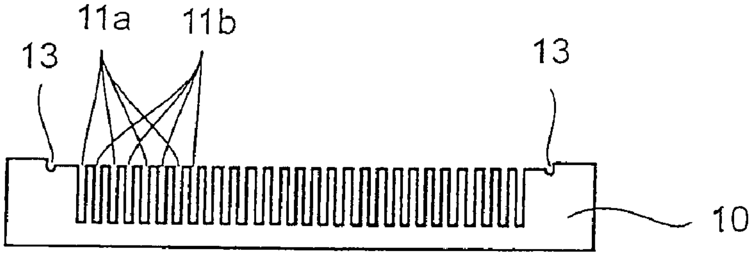
FIG. 7*c* shows a cross section through lower housing part (10) along the plane C-C.

FIG. 7*c* shows the cross section through the lower housing part 10 along the line C-C in FIG. 7*a*. The feed channels 11*a* for the fluid A and 11*b* for the fluid B run alternately parallel without there being any cross connection between these two feed channels. On the upper side of the lower housing part 10 there is again a groove 13 for the insertion of a sealing ring.

Figure 8A:
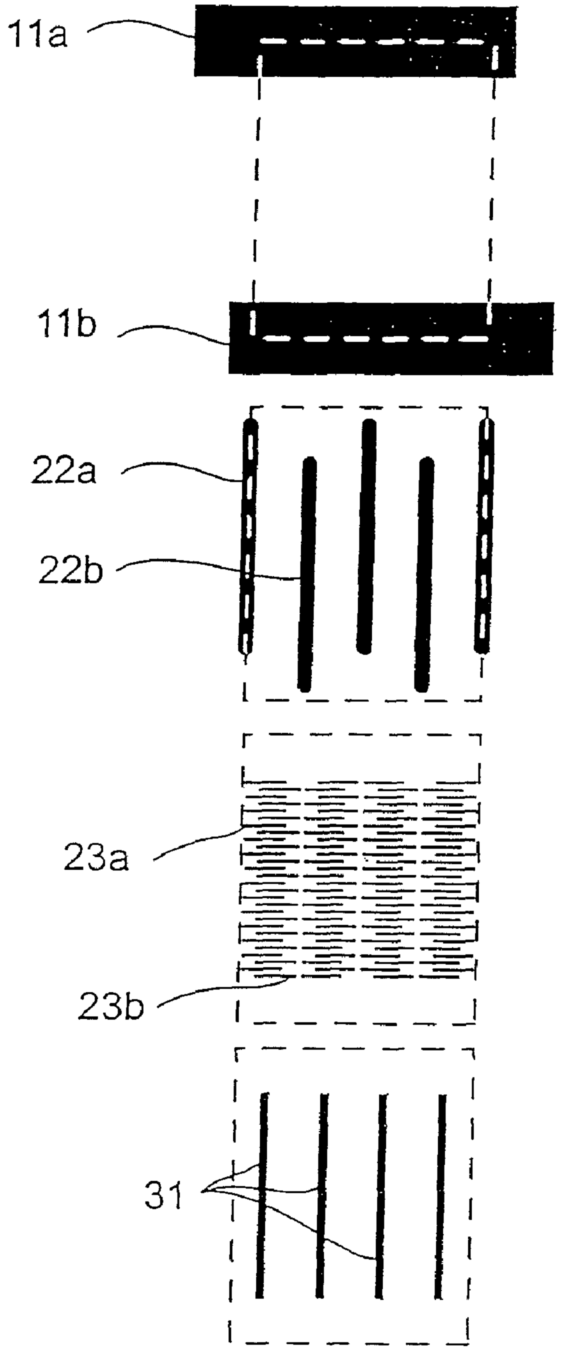
FIG. 8*a* shows a schematic illustration of a static micro-mixer having two different slotted plates and slot openings (22, 23) arranged offset in relation to one another.

FIG. 8*a* shows the schematic illustration of a static lamination micro-mixer having the two different slot openings 22*a*/22*b* and 23*a*/23*b*. The slot openings 22*a* and 22*b* of the first slotted plate form the feed channels for the second slotted plate having small slot openings 23*a* and 23*b*. The slot openings 22*a*/22*b* and 23*a*/23*b* are in each case rotated through 90° in relation to one another.

Figure 8B:
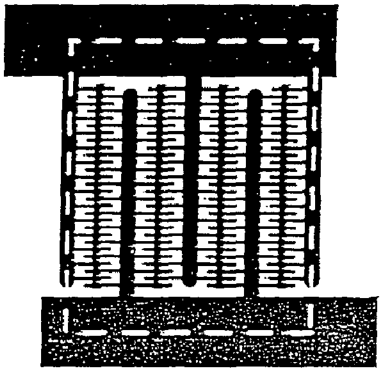
FIG. 8*b* shows a schematic illustration of an assembled static lamination micro-mixer having two different slotted plates.

FIG. 8*b* shows the plan view of such a static micro-mixer according to FIG. 8*a* comprising two different slotted plates, whose slot openings are rotated through 90° in relation to one another.

Figure 9A:
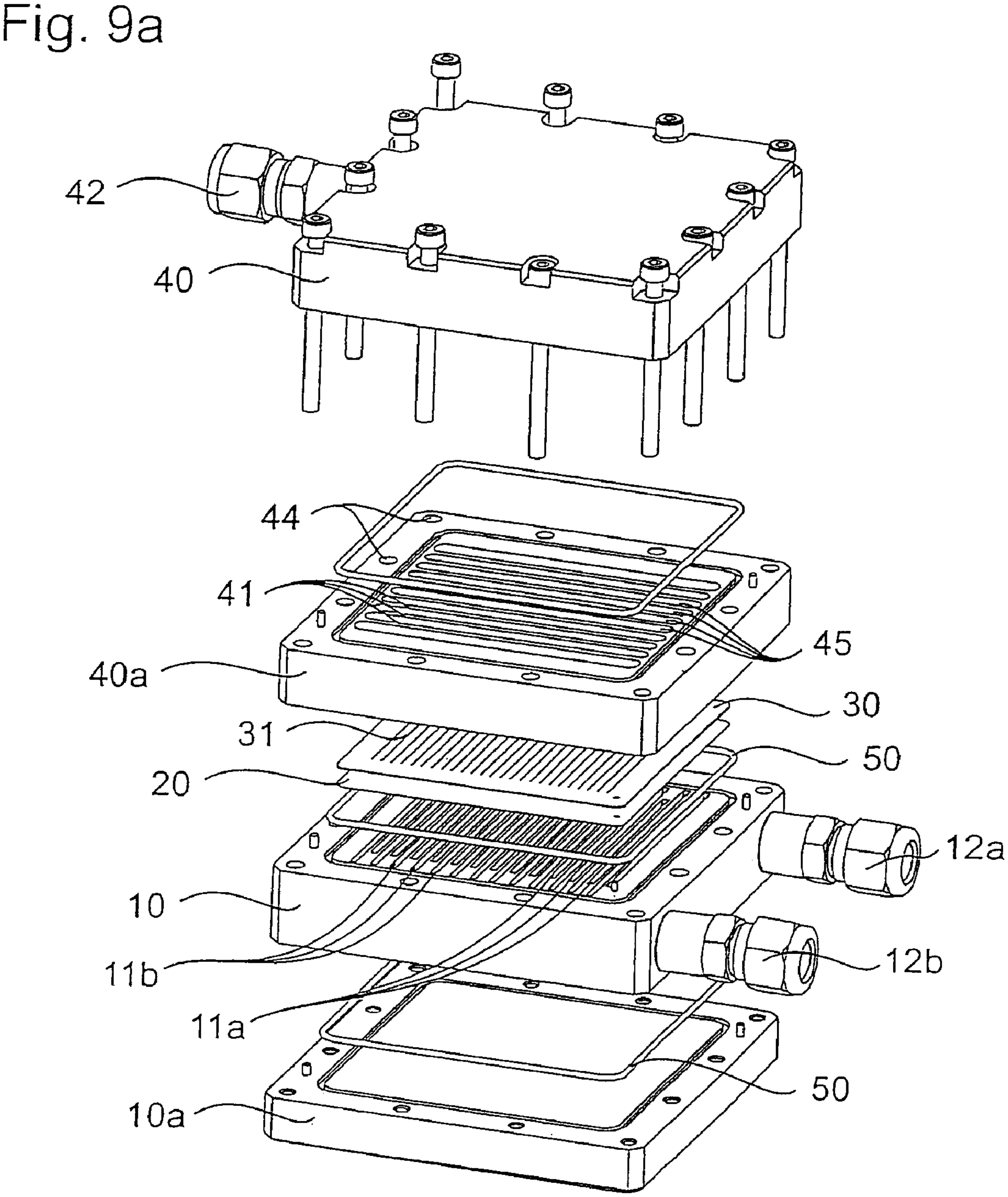
FIG. 9*a* shows exploded illustrations of lamination micro-mixers with a parallel offset arrangement of the channels in order to divide the fluids in the housing.
Figure 9B:
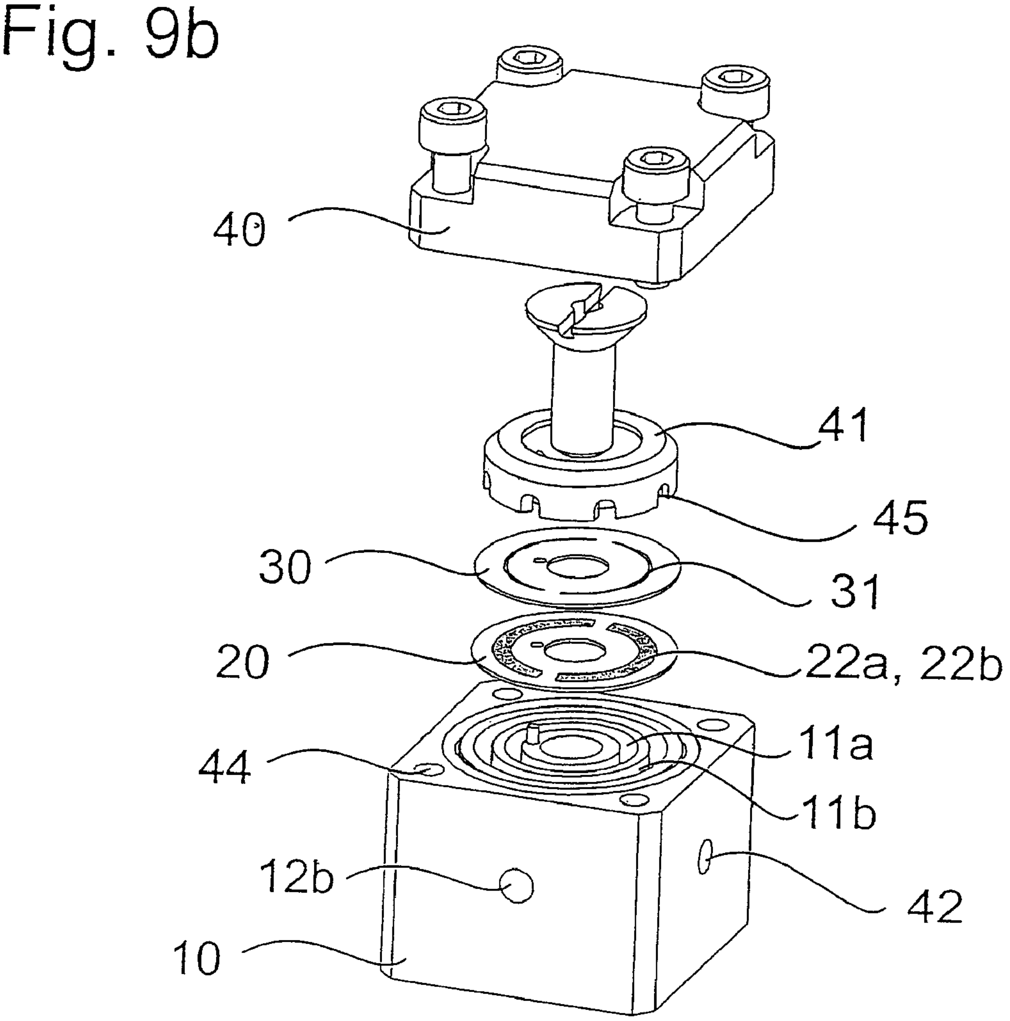
FIG. 9*b* shows exploded illustrations of lamination micro-mixers having a radially concentric arrangement of the channels in order to divide the fluids in the housing.

FIG. 9*a* and FIG. 9*b* show two exemplary embodiments of lamination micro-mixers in an exploded illustration. According to these, the slot openings in the slotted plate, the slot openings in the aperture plate and also the channels for distributing the fluids can be arranged to be offset circularly or in parallel.

Figure 10:
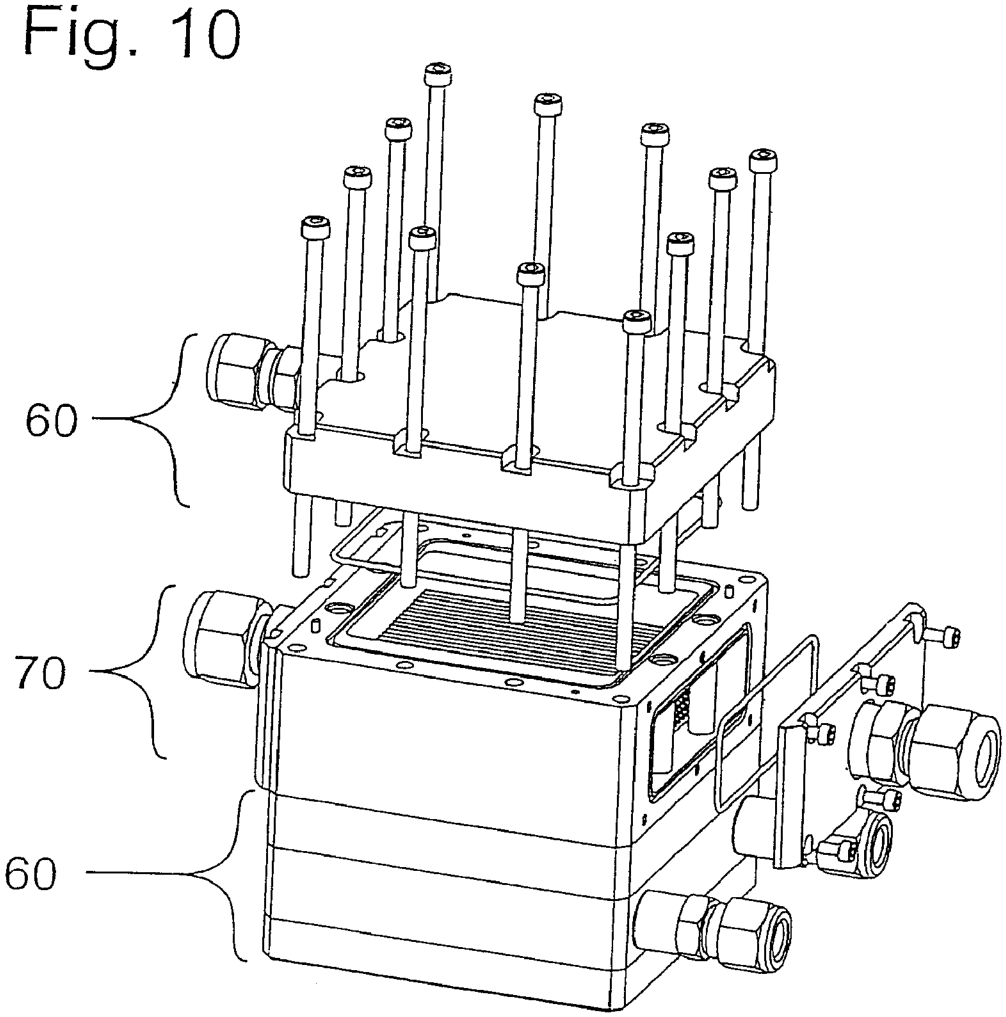
FIG. 10 shows a lamination micro-mixer (60) (cf.

FIG. 10 shows an exemplary embodiment relating to the use of a lamination micro-mixer as a constituent part of an integrated arrangement for carrying out physical-chemical conversions. In the case presented, lamination micro-mixer (60) and bundled-tube heat exchanger (17) are integrated into one component.

LIST OF REFERENCE SYMBOLS

10, 10*a* Lower housing part
11*a* Feed channel for fluid A
11*b* Feed channel for fluid B
12*a* Fluid inlet for fluid A
12*b* Fluid inlet for fluid B
13 Groove for sealing ring
14 Fluid inlet channel
20 Slotted plate
21 Slotted region
22*a* Slot opening for fluid A
22*b* Slot opening for fluid B
23*a* Slot opening for fluid A
23*b* Slot opening for Fluid B
30 Aperture plate
31 Aperture slot
40, 40*a*, Upper housing part
41 Supporting structure
42 Fluid outlet
44 Opening for fixing element
45 Mixing chamber
50 Sealing ring
60 Micro-mixer
70 Bundled-tube heat exchanger

We claim:

1. A static lamination micro-mixer for mixing, dispersing, emulsifying or suspending at least first and second fluid phases, the micro-mixer comprising:

a lower housing part having a first feed channel for the first fluid phase and a second feed channel for the second fluid phase, wherein the first and second feed channels have partial openings on an upper side of the lower housing part;

at least one slotted plate resting on the lower housing part and having first slot openings and second slot openings, wherein the first and second slot openings completely penetrate the slotted plate and are arranged in pairs;

an aperture plate resting on the slotted plate and having at least one slot-shaped aperture opening, wherein the at least one aperture opening completely penetrates the aperture plate; and a mixing chamber located above the aperture plate, wherein one end of the first slot openings of each pair is in direct fluidic contact with the first feed channel in the lower housing part and one end of the second slot openings of each pair is in direct fluidic contact with the second feed channel in the lower housing part, wherein the first and second slot openings overlap the aperture opening in the aperture plate, wherein an overlap between the partial openings on the upper side of the lower housing part, the first and second slot openings in the slotted plate and the aperture opening in the aperture plate is nonidentical in a vertical projection onto the slotted plate, such that a first continuous, at least twice deflected, fluid pathway is formed from the first feed channel in the lower housing part, through the first slot openings of each pair in the slotted plate, to the mixing chamber located above the aperture plate, and a second continuous, at least twice deflected, fluid pathway is formed from the second feed channel in the lower housing part, through the second slot openings of each pair in the slotted plate, to the mixing chamber located above the aperture plate.

2. The micro-mixer according to claim 1, wherein the at least one slotted plate comprises additional slot openings and/or the aperture plate comprises additional aperture slots.

3. The micro-mixer according to claim 1, wherein the first and second slot openings in the at least one slotted plate are configured so that the first and second fluid phases enter the at least one aperture slot of the aperture plate or an additional slotted plate located above.

4. The micro-mixer according to claim 1, wherein a continuous opening of the at least one slot-shaped aperture opening of the aperture plate overlaps the first and second slot openings in the at least one slotted plate, wherein the first and second fluid phases come into contact with one another in the continuous opening of the at least one slot-shaped aperture opening of the aperture plate.

5. The micro-mixer according to claim 1, wherein the first and second slot openings in the at least one slotted plate are arranged obliquely in relation to one another.

6. The micro-mixer according to claim 1, wherein a top view of the first and second slot openings in the at least one slotted plate is configured in the shape of a funnel or lobe.

7. The micro-mixer according to claim 1, further comprising a plurality of additional slotted plates located adjacent to the at least one slotted plate and/or a plurality of additional aperture plates located adjacent to the aperture plate, wherein the pluralities of additional slotted plates and/or additional aperture plates are arranged directly above one another or offset with respect to one another.

8. The micro-mixer according to claim 1, further comprising additional slot-shaped aperture openings in the aperture plate, wherein the additional slot-shaped aperture openings are offset parallel to one another and/or are arranged in a periodic pattern with respect to one another.

9. The micro-mixer according to claim 1, wherein the first and second slot openings in the at least one slotted plate and the at least one slot-shaped aperture opening in the aperture plate are arranged at an angle with respect to one another.

10. The micro-mixer of claim 9, wherein the angle is up to 90°.

11. The micro-mixer according to claim 1, wherein the first and second slot openings in the at least one slotted plate and the at least one slot-shaped aperture opening slot in the aperture plate have a width of less than 500 μm.

12. The micro-mixer of claim 11, wherein the width is less than 100 μm.

13. The micro-mixer according to claim 1, wherein the at least one slotted and aperture plates are formed, partly or completely, of metal, glass, ceramic or plastic or of a combination of these materials.

14. The micro-mixer according to claim 1, wherein the at least one slotted and aperture plates comprise a stack of micro-structured thin plates.

15. The micro-mixer according to claim 14, wherein the thin micro-structured plates are connected materially by means of soldering, welding, diffusion welding or adhesive bonding or with a force fit by means of screwing, pressing or riveting.

16. The micro-mixer according to claim 1, wherein the at least one slot-shaped aperture opening in the aperture plate and the first and second slot openings in the at least one slotted plate are of branched configuration.

17. The micro-mixer according to claim 1, wherein the micro-mixer further comprises an upper housing part.

18. The micro-mixer according to claim 17, further comprising a plurality of support structures fitted to the upper housing part.

19. The micro-mixer according to claim 17, wherein the lower housing part is configured to promote spatial distribution of the first and second fluid phases.

20. The micro-mixer according to claim 1, wherein the first and second feed channels are arranged offset parallel from one another, radially, concentrically or behind one another in order to distribute the first and second fluid phases in the lower housing part.

21. The micro-mixer according to claim 1, wherein the at least one first and second feed channels are designed with variable cross sections in order to distribute the first and second fluid phases in the lower housing part.

22. The micro-mixer of claim 1, wherein the at least one slot-shaped aperture opening of the aperture plate is located between the first and second slot openings of the at least one slotted plate.

23. The micro-mixer according to claim 1, wherein the at least one first and second feed channels are designed with constant cross sections in order to distribute the first and second fluid phases in the lower housing part.

24. A method for mixing, dispersing, emulsifying or suspending at least first and second fluid phases, the method comprising:

providing a lower housing part having a first feed channel for the first fluid phase and a second feed channel for the second fluid phase, wherein the first and second feed channels have partial openings on an upper side of the lower housing part;

leading the first fluid phase from the partial opening of the first feed channel through first slot openings of at least one slotted plate and into at least one slot-shaped aperture opening in an aperture plate, wherein the at least one slotted plate rests on the lower housing part, wherein the aperture plate rests on the slotted plate and the at least one slot-shaped aperture opening completely penetrates the aperture plate;

leading the second fluid phase from the partial opening of the second feed channel through second slot openings of the at least one slotted plate and into the at least one slot-shaped aperture opening in the aperture plate, wherein the first and second slot openings completely penetrate the at least one slotted plate and are arranged in pairs, wherein one end of the first slot openings of each pair is in direct fluidic contact with the first feed channel in the lower housing part and one end of the second slot openings of each pair is in direct fluidic contact with the second feed channel in the lower housing part, wherein the first and second slot openings overlap the aperture opening in the aperture plate, wherein an overlap between the partial openings on the upper side of the lower housing part, the first and second slot openings in the slotted plate and the aperture opening in the aperture plate is nonidentical in a vertical projection onto the slotted plate;

forming a first continuous, at least twice deflected, fluid pathway from the first feed channel in the lower housing part, through the first slot openings of each pair in the slotted plate, to the at least one slot-shaped aperture opening of the aperture plate; and forming a second continuous, at least twice deflected, fluid pathway from the second feed channel in the lower housing part, through the second slot openings of each pair in the slotted plate, to the at least one slot-shaped aperture opening of the aperture plate.

25. The method of claim 24, further comprising:

producing the at least one slotted plate and/or the aperture plate by punching, embossing, milling, erosion, etching, plasma etching, laser cutting or a LIGA technique.

* * * * *